(12) United States Patent
Singh et al.

(10) Patent No.: US 11,074,946 B2
(45) Date of Patent: Jul. 27, 2021

(54) TEMPERATURE DEPENDENT VOLTAGE DIFFERENTIAL SENSE-AMPLIFIER

(71) Applicant: NXP B.V., Eindhoven (NL)

(72) Inventors: Jainendra Singh, Bangalore (IN); Jwalant Kumar Mishra, Bangalore (IN); Patrick van de Steeg, Oss (NL)

(73) Assignee: NXP B.V., Eindhoven (NL)

( * ) Notice: Subject to any disclaimer, the term of this patent is extended or adjusted under 35 U.S.C. 154(b) by 25 days.

(21) Appl. No.: 16/705,165

(22) Filed: Dec. 5, 2019

(65) Prior Publication Data
US 2021/0174845 A1 Jun. 10, 2021

(51) Int. Cl.
| G11C 7/08 | (2006.01) |
| G11C 11/419 | (2006.01) |
| G11C 7/04 | (2006.01) |
| G11C 7/06 | (2006.01) |
| G11C 11/417 | (2006.01) |

(52) U.S. Cl.
CPC ............... *G11C 7/08* (2013.01); *G11C 7/04* (2013.01); *G11C 7/062* (2013.01); *G11C 11/417* (2013.01); *G11C 11/419* (2013.01)

(58) Field of Classification Search
CPC .. G11C 7/08; G11C 7/04; G11C 7/062; G11C 11/417; G11C 11/419
USPC ................... 365/154, 207, 205, 211, 185.21
See application file for complete search history.

(56) References Cited

U.S. PATENT DOCUMENTS

| 4,912,674 A | 3/1990 | Matsumoto et al. |
| 5,084,873 A | 1/1992 | Houston |
| 5,935,400 A | 8/1999 | Takami et al. |
| 6,163,048 A | 12/2000 | Hirose et al. |
| 6,272,039 B1 | 8/2001 | Clemens et al. |

(Continued)

FOREIGN PATENT DOCUMENTS

JP 2013-254548 A 12/2013

OTHER PUBLICATIONS

Notice of Allowance for U.S. Appl. No. 16/399,939, 6 pgs. (dated Mar. 23, 2020).

(Continued)

*Primary Examiner* — Connie C Yoha
(74) *Attorney, Agent, or Firm* — Rajeev Madnawat

(57) ABSTRACT

A voltage differential sense amplifier circuit for a semiconductor memory circuit is disclosed. The voltage differential sense amplifier circuit includes a first and second pluralities of transistors. A first bias control circuit is included to bias the first plurality of transistors. The first bias control circuit is connected to body terminals of the first plurality of transistors for providing a temperature dependent first bias voltage to control threshold voltages of the first plurality of transistors. The temperature defendant first bias voltage is generated based on junction leakages at the body terminals of the first plurality of transistors. A second bias control circuit is included to bias the second plurality of transistors. The second bias control circuit is connected to body terminals of the second plurality of transistors for providing a temperature dependent second bias voltage to control threshold voltages of the second plurality of transistors. The temperature dependent second bias voltage is generated based on junction leakages at the body terminals of the second plurality of transistors.

14 Claims, 3 Drawing Sheets

(56) References Cited

U.S. PATENT DOCUMENTS

| | | |
|---|---|---|
| 6,484,265 B2 | 11/2002 | Borkar et al. |
| 6,566,914 B2 | 5/2003 | Bruneau et al. |
| 6,593,799 B2 | 7/2003 | De et al. |
| 6,762,474 B1 | 7/2004 | Mills, Jr. |
| 7,681,628 B2 | 3/2010 | Joshi et al. |
| 7,715,246 B1 | 5/2010 | Kim |
| 7,928,769 B1 | 4/2011 | Huang |
| 8,004,907 B2 | 8/2011 | Russell et al. |
| 8,018,780 B2 | 9/2011 | Houston et al. |
| 8,902,667 B2 | 12/2014 | Mu et al. |
| 9,478,303 B1 | 10/2016 | Parker |
| 9,583,178 B2 | 2/2017 | Jung et al. |
| 9,818,460 B2 | 11/2017 | Kolar et al. |
| 9,865,333 B2 | 1/2018 | Dhori et al. |
| 9,875,788 B2 | 1/2018 | Jung et al. |
| 9,881,682 B1 | 1/2018 | Tang et al. |
| 10,115,471 B1 | 10/2018 | Yang et al. |
| 10,431,300 B2 | 10/2019 | Pyo et al. |
| 10,679,714 B2 | 6/2020 | Singh et al. |
| 10,685,703 B2 | 6/2020 | Singh et al. |
| 2003/0043640 A1 | 3/2003 | Marr et al. |
| 2004/0109344 A1 | 6/2004 | Yamauchi |
| 2005/0162951 A1 | 7/2005 | Dudeck et al. |
| 2005/0213370 A1 | 9/2005 | Khellah et al. |
| 2006/0226889 A1* | 10/2006 | Gupta ............... H03K 3/011 327/534 |
| 2007/0030049 A1* | 2/2007 | Yoshikawa ............ G01K 7/01 327/512 |
| 2007/0079204 A1 | 4/2007 | Ong |
| 2007/0097756 A1 | 5/2007 | Hirota et al. |
| 2007/0121358 A1 | 5/2007 | Hirota et al. |
| 2008/0298155 A1 | 12/2008 | Miyako |
| 2009/0080276 A1 | 4/2009 | Cai et al. |
| 2009/0141580 A1 | 6/2009 | Evans et al. |
| 2010/0074028 A1 | 3/2010 | Hirose et al. |
| 2010/0254199 A1 | 10/2010 | Houston |
| 2010/0321100 A1* | 12/2010 | Guo ............... H03K 17/162 327/537 |
| 2010/0329054 A1 | 12/2010 | Azimi et al. |
| 2011/0013443 A1 | 1/2011 | Lee et al. |
| 2011/0063895 A1 | 3/2011 | Komatsu et al. |
| 2011/0089419 A1 | 4/2011 | Yamazaki et al. |
| 2011/0251819 A1 | 10/2011 | Ong |
| 2012/0081975 A1 | 4/2012 | Yamaki |
| 2012/0170391 A1 | 7/2012 | Janardan et al. |
| 2012/0327725 A1 | 12/2012 | Clark et al. |
| 2013/0058177 A1 | 3/2013 | Seshadri et al. |
| 2013/0099850 A1* | 4/2013 | Po ............... H03K 19/0175 327/434 |
| 2013/0121057 A1 | 5/2013 | Le Neel |
| 2013/0170287 A1 | 7/2013 | Walsh et al. |
| 2013/0272074 A1 | 10/2013 | Tanaka |
| 2013/0286718 A1 | 10/2013 | Krilic |
| 2014/0129903 A1 | 5/2014 | Yoon et al. |
| 2014/0184262 A1 | 7/2014 | Poindexter et al. |
| 2014/0293723 A1 | 10/2014 | Grover et al. |
| 2015/0085566 A1 | 3/2015 | Jain et al. |
| 2015/0213844 A1 | 7/2015 | Nguyen et al. |
| 2016/0042797 A1 | 2/2016 | Kim |
| 2016/0267980 A1 | 9/2016 | Akamine et al. |
| 2017/0069659 A1 | 3/2017 | Kawasumi |
| 2017/0084316 A1 | 3/2017 | Kulkarni |
| 2017/0092367 A1 | 3/2017 | Lee et al. |
| 2017/0125128 A1 | 5/2017 | Lee et al. |
| 2017/0148519 A1 | 5/2017 | Jin |
| 2017/0278555 A1 | 9/2017 | Su et al. |
| 2017/0301395 A1 | 10/2017 | Clark et al. |
| 2017/0351802 A1 | 12/2017 | Chang et al. |
| 2018/0061486 A1 | 3/2018 | Itoh |
| 2018/0114567 A1 | 4/2018 | Tang |
| 2018/0114583 A1 | 4/2018 | Wang et al. |
| 2019/0019550 A1 | 1/2019 | Chevallier |
| 2019/0130967 A1 | 5/2019 | Danjean et al. |
| 2019/0244641 A1 | 8/2019 | Jamal et al. |
| 2019/0296734 A1 | 9/2019 | Yokoyama et al. |
| 2019/0304962 A1 | 10/2019 | Prabhat et al. |
| 2020/0075081 A1 | 3/2020 | Hush |
| 2020/0105314 A1 | 4/2020 | Yu et al. |
| 2020/0105315 A1 | 4/2020 | Chang et al. |
| 2020/0135260 A1 | 4/2020 | Venkata |

OTHER PUBLICATIONS

Notice of Allowance for U.S. Appl. No. 16/129,718 7 pgs. (dated Dec. 27, 2019).

Non-Final Rejection for U.S. Appl. No. 16/399,939 16 pgs. (dated Dec. 19, 2019).

U.S. Appl. No. 16/129,718, 28 pgs. (filed Sep. 12, 2018).

U.S. Appl. No. 16/399,939, 34 pgs. (filed Apr. 30, 2019).

Notice of Allowance for U.S. Appl. No. 16/129,718 6 pgs. (dated May 6, 2020).

Notice of Allowance for U.S. Appl. No. 16/129,718 6 pgs. (dated Apr. 14, 2020).

Non-Final Rejection for U.S. Appl. No. 16/129,718, 8 pgs. (dated Sep. 19, 2019).

* cited by examiner

Fig. 2

| Temperature (C) | VPW over different process @0.8V supply (mV) | | |
|---|---|---|---|
| | SNSP | TYPICAL | FNFP |
| -40 | 255 | 225 | 191 |
| 25 | 200 | 172 | 140 |
| 125 | 95 | 93 | 87 |

Fig. 3

| Temp. (C) | Resolve time (ns) | | | |
|---|---|---|---|---|
| | 20mV differential | | 40mV differential | |
| | SVT with no back-biasing | SVT with back-biasing | SVT with no back-biasing | SVT with back-biasing |
| -40 | 1.113 | 0.896 | 0.841 | 0.709 |
| 25 | 0.856 | 0.747 | 0.695 | 0.619 |
| | | | | |

Fig. 4

| Temp. (C) | Resolve time (ns) | | | |
|---|---|---|---|---|
| | 20mV differential | | 40mV differential | |
| | SVT with no back-biasing | SVT with back-biasing | SVT with no back-biasing | SVT with back-biasing |
| -40 | 0.313 | 0.205 | 0.067 | 0.047 |
| 25 | 0.158 | 0.142 | 0.043 | 0.034 |
| | | | | |

TEMPERATURE DEPENDENT VOLTAGE DIFFERENTIAL SENSE-AMPLIFIER

CROSS REFERENCE TO RELATED APPLICATIONS

This application is related to application Ser. No. 16/129,718 entitled "TRANSISTOR BODY BIAS CONTROL CIRCUIT FOR SRAM CELLS" by Jainendra Singh and filed on Sep. 12, 2018, which is being incorporated herein by reference in its entirety.

BACKGROUND

A static random access memory (SRAM) array employs a collection of cross-coupled CMOS inverters as memory elements having NMOS and PMOS transistors. Typically, the NMOS transistors are used as pull-down devices, and the PMOS transistors are used as pull-up devices. Typically, the NMOS transistors are contained in a p-substrate and the PMOS transistors are contained in an n-well within the p-substrate.

A semiconductor memory circuit stores data electronically. One type of memory circuit is a SRAM, which is made up of an array of SRAM cells. The SRAM cells retain data in a static form. An SRAM cell typically includes pull-up and pull-down transistors, pass-gate transistors, bit lines, and a word line. Threshold voltages of the pull-up, pull-down, and pass-gate transistors determine a static noise margin (SNM) and a write margin (i.e. stability of read and write operations, respectively) of the SRAM cell. However, as semiconductor device sizes shrink, fluctuations in the threshold voltages increase due to random dopant fluctuation (RDF), line edge roughness (LER), and short channel effects (SCE). These fluctuations in the threshold voltages result in fluctuations in the drive strengths of the transistors, which degrades the SNM and the write margin.

A conventional approach to reduce the degradation of the SNM and the write margin is to use a read and write assist circuit. A read assist circuit ensures an adequate SNM by decreasing the drive strengths of the pass-gate transistors or increasing the drive strengths of the pull-up transistors. On the other hand, a write assist circuit ensures an adequate write margin by increasing the drive strengths of the pass-gate transistors or decreasing the drive strengths of the pull-up transistors. These conflicting drive-strength requirements make it difficult to achieve both an adequate SNM and an adequate write margin at the same time. Further, the read assist technique degrades the read current of the SRAM cell, which affects its speed, whereas the write assist technique increases power consumption. The SNM and the write margin of the SRAM cell are further dependent on temperature. The SNM degrades at high temperatures, while the write margin degrades at low temperatures. Thus, an improvement in the SNM results in degradation in the write margin, and vice-versa. The read and write assist circuits may use biasing techniques along with the read and write assist techniques. The biasing techniques include generating a bias voltage that is provided to body terminals of the transistors in the SRAM cells. The biasing techniques may be implemented with biasing circuits that include various combinations of transistors, resistors, diodes, and the like. However, employing the biasing circuits consumes additional area and power.

A sense-amplifier is used to read differential voltage between two bit-lines for SRAM/ROM data read. Due to high threshold voltage of the transistor in the sense-amplifier at colder temperatures, a typical sense-amplifier takes a longer time to resolve the final read operation. The transistors in the SRAM cell are functioning as amplifiers; it is the internal positive feedback that creates the bistable operation that is used to store information. However, the sizes of these transistors are kept as small as possible so that more of them can be fit into a given amount of area, and to keep leakage currents as small as possible. When a read operation occurs, the outputs of the two internal transistors are connected to the bit lines by the word-select transistors. The internal transistors need to drive the bit lines low through the word select transistors, which means that the available signal is somewhat attenuated, both by the voltage offsets introduced by the select transistors and by the relatively high capacitance of the bit lines. The resulting differential signal doesn't look at all like a "normal" logic signal. It is the purpose of the sense amplifiers on each pair of bit lines to turn that weak differential signal into a normal logic signal that can then be fed to additional data multiplexers and/or I/O pin drivers.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a voltage differential sense amplifier for semiconductor memory circuit is disclosed. The voltage differential sense amplifier includes a first and second pluralities of transistors. A first bias control circuit is included to bias the first plurality of transistors. The first bias control circuit is connected to body terminals of the first plurality of transistors for providing a temperature dependent first bias voltage to control threshold voltages of the first plurality of transistors. The temperature defendant first bias voltage is generated based on junction leakages at the body terminals of the first plurality of transistors. A second bias control circuit is included to bias the second plurality of transistors. The second bias control circuit is connected to body terminals of the second plurality of transistors for providing a temperature dependent second bias voltage to control threshold voltages of the second plurality of transistors. The temperature dependent second bias voltage is generated based on junction leakages at the body terminals of the second plurality of transistors.

In another embodiment, a method for biasing a voltage differential sense amplifier for a memory cell is disclosed. The memory cell includes a first and second pluralities of transistors. The method including generating, by a first bias control circuit, a temperature dependent first bias voltage based on junction leakages at body terminals of the first plurality of transistors of the voltage differential sense amplifier, and providing, by the first bias control circuit, the temperature dependent first bias voltage to the body terminals of the first plurality of transistors for controlling threshold voltages of the first plurality of transistors. The method further includes generating, by a second bias control circuit, a temperature dependent second bias voltage based on junction leakages at body terminals of the second plurality of transistors of the memory cell, and providing, by the second bias control circuit, the temperature dependent second bias voltage to the body terminals of the second plurality of transistors for controlling threshold voltages of the second plurality of transistors.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

FIGS. 2-4 show measurement tables for the voltage differential sense amplifier circuit of FIG. 1;

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in details in the description so as not to obfuscate the present disclosure.

Various techniques are available to improve speed of sense-amplifiers. In some applications, for example in mobile devices, low voltage and low leakage power of the transistors in the sense amplifier is critical requirements. However, the low voltage operation of sense-amplifier causes high resolve-time at cold temperature. This sense-amplifier temperature dependent back-biasing helps improve the resolve-time (speed) at lower temperatures. The temperature dependent back biasing improves speed of sense-amplifier at cold temperature while keeping leakage current variations within a threshold at higher temperatures, for example, temperatures higher than room temperature.

For low voltage operations with respect to the read operations, sense-amplifier is also a critical design element. Read margin of SRAM is also limited at cold temperature (−50 C) which is limited by bit-cell current & sense-amplifier resolve-time. While improving read margin effects static leakage at hot temperature. Temperature dependent design technique to improve read margin will not affect static leakage at hot temperature.

Embodiments described herein use a temperature dependent back-biasing technique in a sense-amplifier. Read margin (voltage difference) of SRAM/ROM becomes progressively worse with temperature decrease from the room temperature to −50 C. Similarly, static leakage current of a SRAM bit-cell progressively becomes higher from the room temperature to 150 C.

Figure 1:
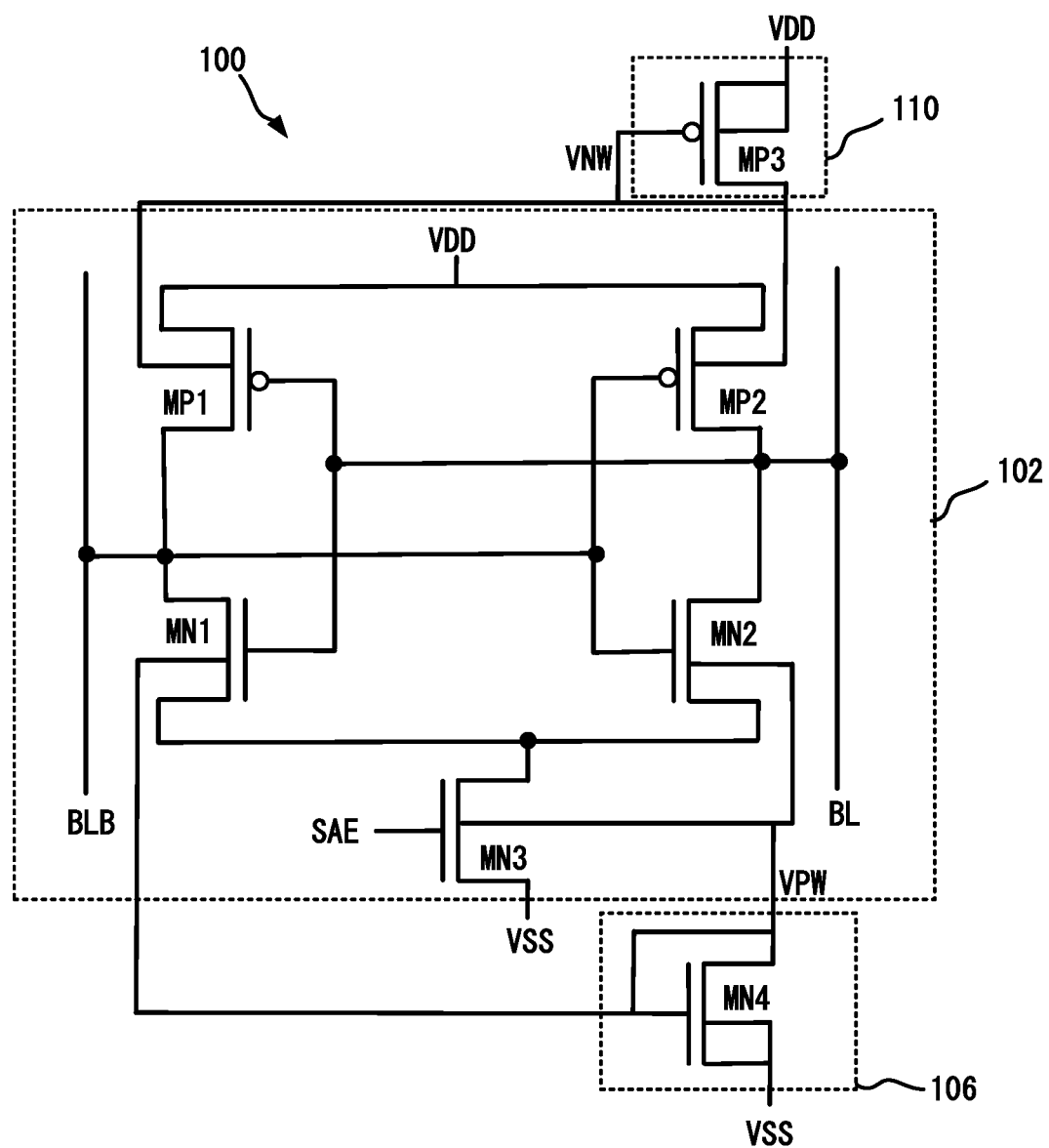
FIG. 1 depicts a voltage differential sense amplifier circuit for a semiconductor memory circuit in accordance with one or more embodiments of the present disclosure.

Referring now to FIG. 1, a schematic block diagram of a voltage differential sense amplifier circuit 100 for a semiconductor memory circuit. The memory circuit is an electronic data storage device on an integrated circuit (IC) (not shown). The voltage differential sense amplifier circuit 100 includes a plurality of pull-up and pull-down transistors 102, a bias control circuit 106, and another bias control circuit 110. In one embodiment, the bias control circuit 106 is a transistor-based diode. The transistor-based diode corresponds to one or more transistors connected to form a diode. Similarly, the bias control circuit 110 is a transistor based diode. The memory circuit 100 further includes bit lines BL and BLB and a sense-amplifier enable line SAE.

The voltage differential sense amplifier circuit 100 is connected to the true and complementary bit lines BLB and BL. During a read operation, the true and complementary bit lines BLB and BL read the data from the voltage differential sense amplifier circuit 100. The data read from the voltage differential sense amplifier circuit 100 will correspond to a logical '0' or a logical '1'.

The bias control circuit 106 is connected to the voltage differential sense amplifier circuit 100 and receives junction leakage currents that are generated at body terminals of the transistors MN1, MN2, MN3, MP1, MP2 of the voltage differential sense amplifier circuit 100 where MN1 and MN2 are pull-down transistors and MP1 and MP2 are pull-up transistors. A junction leakage may be generated due to various short-channel effects, distance between the transistors, and the like. The junction leakages also generate biasing voltages. The bias control circuit 106 generates the body bias voltage VPW based on the junction leakages in the transistors 102, and provides the body bias voltage VPW to the NMOS transistors MN1, MN2 and MN3. The bias voltage VPW is temperature-dependent, i.e., at a low temperature (e.g., −40° C.), the bias voltage VPW is at a higher voltage level than when the temperature is higher (e.g., 150° C.). That is, VPW at a low temperature is higher than VPW at a high temperature. The bias control circuit 106 is coupled to the ground (VSS).

The leakage current from the transistors of the voltage differential sense amplifier circuit 100 needs to passthrough the transistor MN4 via the subthreshold leakage of the transistor MN4. The subthreshold leakage or subthreshold drain current is the current between the source and drain of the transistor MN4 when the transistor is in subthreshold region, or weak-inversion region, that is, for gate-to-source voltages below the threshold voltage. The subthreshold leakage varies at a faster rate than the variations in the junction leakage of the transistors 102. Therefore, the changes in VPW with temperature are used to generate a body biasing voltage of the transistors MN1, MN2 and MN3 to keep the read margin or voltage difference of the voltage differential sense amplifier circuit 100 within a voltage band with the variations in the temperature to prevent read errors.

A bias control circuit 110 is included to provide a temperature dependent body biasing voltage to the PMOS transistors MP1 and MP2. Using the junction leakage of the transistors MP1 and MP2, the bias control circuit 110 generates a voltage VNW that is used to body bias the transistors MN1 and MN2. The bias control circuit 110 includes a PMOS transistor MP3 which is a diode formation using a transistor. In some embodiments, more than one transistor in a diode configuration similar to the transistor MP3 may be used in the bias control circuit 110. The bias control circuit 110 is coupled to the supply voltage (VDD).

The source of the transistor MP3 is connected to the body of the transistor MP3 and also to the supply voltage (VDD)

terminal. The gate and the drain of the transistor MP3 are shorted and coupled with the body wells of the transistors MP1 and MP2. The gate of the transistor MP1 is coupled with the bit line BL and the gate of the transistor MP2 is coupled with the bit line BLB. The sources of the transistors MP1 and MP2 are coupled with the supply voltage VDD. Typically, the sources of the transistors MP1 and MP2 can be coupled to their bodies to provide body bias voltage equal to VDD. However, since VDD remains constant with temperature, such body biasing will not compensate for the changes in the leakage current of the transistors MP1 and MP2 with the changes in temperature. Similarly, the sources of the transistors MN1, MN2 and MN3 may typically be coupled to their body wells and to the ground. However, since the ground voltage remains constant with the variations in the temperature, changes in the leakage current of the transistors MN1, MN2 and MN3 with temperature will not be compensated by a constant body bias voltage. Therefore, the body biasing voltage VPW for the transistors MN1, MN2 and MN3 is generated by the transistor MN4 that is fabricated as a transistor diode in which the drain is coupled to the gate and the source is connected to the body terminal. The transistor MP3 is similarly fabricated in a diode configuration in which the source is connected to the gate and the drain is connected to its body terminal.

The first bias control circuit 110 includes a first biasing transistor MP3 in a diode configuration in which a drain and a gate of the first biasing transistor are connected to a supply voltage, and a source of the first biasing transistor is connected to the body terminals of each of the first plurality of transistors. The second bias control circuit 106 includes a second biasing transistor MN4 in a diode configuration in which a source and a gate of the second biasing transistor are connected to ground, and a drain of the second biasing transistor is connected to the body terminals of each of the second plurality of transistors.

The first plurality of transistors includes pull-up transistors and the second plurality of transistors includes pull-down transistors. In some examples, the first plurality of transistors are PMOS transistors and the second plurality of transistors are NMOS transistors and the first biasing transistor is a PMOS transistor and the second biasing transistor is an NMOS transistor.

The temperature dependent first bias voltage and the temperature dependent second bias voltage are higher at a first temperature than a second temperature, wherein the first temperature is less than the second temperature. The first bias control circuit 110 and the second bias control circuit 106 regulate an operational speed of sense-amplifier 102 by controlling the threshold voltages.

In semiconductor manufacturing, a process corner is an example of a design-of-experiments (DoE) technique that refers to a variation of fabrication parameters used in applying an integrated circuit design to a semiconductor wafer. Process corners represent the extremes of these parameter variations within which a circuit that has been etched onto the wafer must function correctly. A circuit running on devices fabricated at these process corners may run slower or faster than specified and at lower or higher temperatures and voltages, but if the circuit does not function at all at any of these process extremes the design is considered to have inadequate design margin.

In order to verify the robustness of an integrated circuit design, semiconductor manufacturers will fabricate corner lots, which are groups of wafers that have had process parameters adjusted according to these extremes, and will then test the devices made from these special wafers at varying increments of environmental conditions, such as voltage, clock frequency, and temperature, applied in combination (two or sometimes all three together) in a process called characterization. The results of these tests are plotted using a graphing technique known as a shmoo plot that indicates clearly the boundary limit beyond which a device begins to fail for a given combination of these environmental conditions.

Corner-lot analysis is most effective in digital electronics because of the direct effect of process variations on the speed of transistor switching during transitions from one logic state to another, which is not relevant for analog circuits, such as amplifiers.

The embodiments described herein adjusts the biasing voltage for the pull-up and pull-down transistors to account for the changes in threshold voltage due to process variations.

Fast and Slow MOS fabrication techniques are used in the model files to simulate the MOS for the corner conditions. During the modeling and simulation, for slow MOS, the threshold voltage is increased and for fast MOS, the threshold voltage is decreased.

FIG. 2 shows a table 200 that displays VPW (in mV) versus temperature in Slow NMOS & Slow PMOS (SNPS), typical and Fast NMOS & Fast PMOS (FNFP) modeling processes at VDD=0.8V. As indicated, VPW varies with the rise in temperature. Hence, the table 200 discloses that the biasing voltage for the pull-down transistors MN1, MN2 varies with the changes in temperature. The data in the table 200 shows that the circuit 100 provides an automatically adjusted biasing voltage for the transistors MN1, MN2, MN3. A similar data can be derived for VNW produced by the transistor MP3.

FIG. 3 shows a table 300 to display resolve times under different scenarios, at Standard threshold voltage (SVT) of MP1 and MP2 with no-biasing and with biasing according to the circuit 100. The resolve time is the time that the voltage differential sense amplifier circuit 100 takes to read the stored value via the bit lines BL and BLB. The table 300 displays the resolve times at 20 mv differential and 40 mV differential (i.e., the voltage difference between the bit line BL and the bit line bar BLB). As indicated, the resolve time improves with the biasing according to the embodiments described here. The simulations are done at Process & Voltage (PV) Slow MOS at 0.8V supply voltage. The table 300 displays mean values of resolve time for 20 mV and 40 mV differential voltages.

FIG. 4 display a table 400 that is similar to the table 300 but shows standard deviation value of resolve time for 20 mV and 40 mV differential voltages. As indicated, the embodiments described herein provides an improved resolve time under various temperature conditions. The embodiments described herein use the parasitic leakage of the transistors in the voltage differential sense amplifier circuit 100 to reduce transistor threshold voltage mismatch to improve the resolve time.

Figure 5:
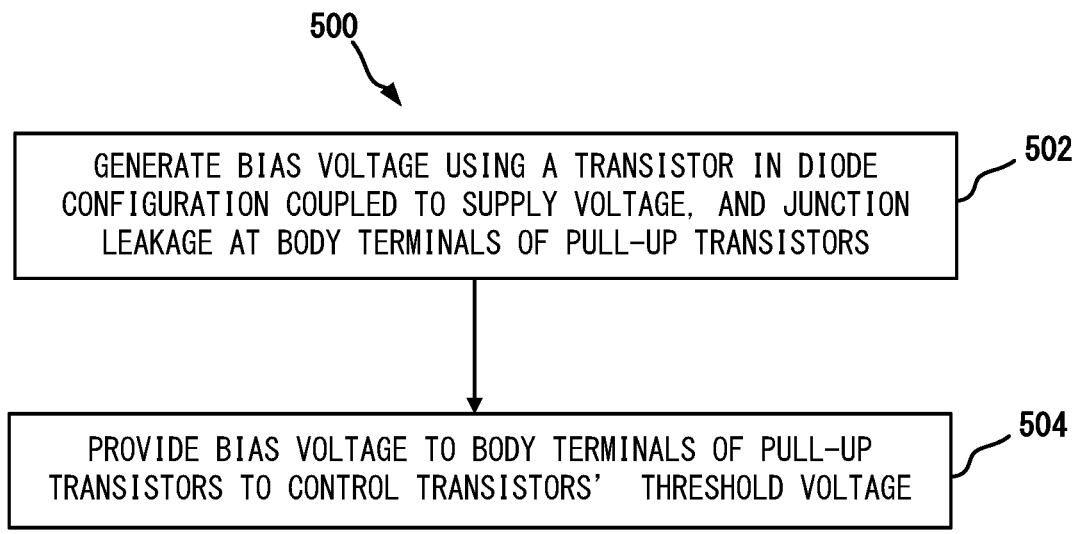
FIG. 5 shows a flow diagram for generating a bias voltage for pull-up transistors of the voltage differential sense amplifier circuit in accordance with one or more embodiments of the present disclosure.

FIG. 5 discloses a method 500 for generating a biasing voltage for the pull-up transistors MP1, MP2 using the junction leakage of MP1, MP2 and the transistor MP3 that is fabricated in a diode configuration. Accordingly, at step 502, a biasing voltage is generated by the transistor MP3 using the junction leakage of the transistors MP1, MP2. At step 502, the generated biasing voltage is applied to the body terminal of the transistors MP1, MP2.

Figure 6:
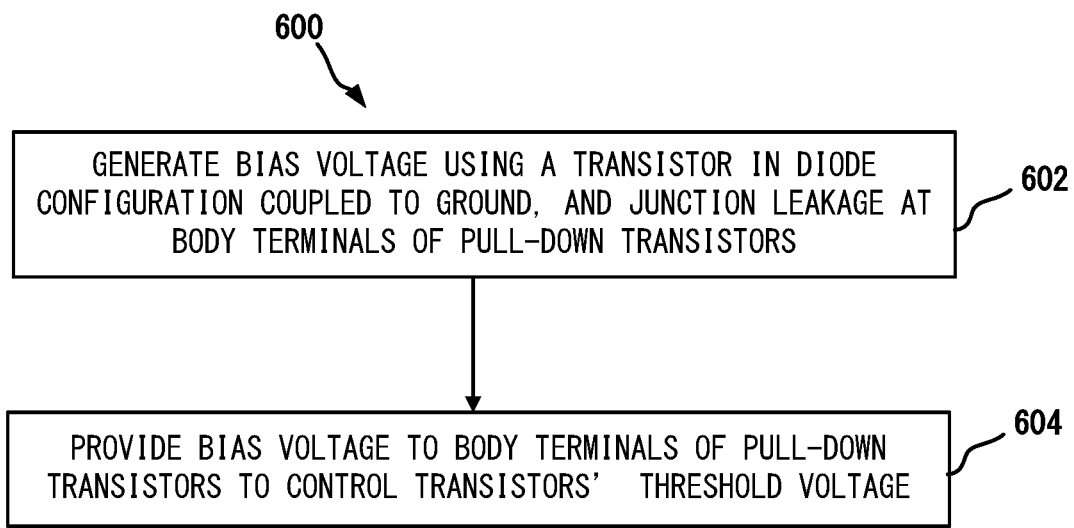
FIG. 6 shows a flow diagram for generating a bias voltage for pull-down transistors of the voltage differential sense amplifier circuit in accordance with one or more embodiments of the present disclosure.

FIG. 6 discloses a method 600 for generating a biasing voltage for the pull-down transistors MN1, MN2 using the junction leakage of MN1, MN2 and the transistor M4 that is fabricated in a diode configuration. Accordingly, at step 602, a biasing voltage is generated by the transistor MN4 using the junction leakage of the transistors MN1, MN2. At step 604, the generated biasing voltage is applied to the body terminal of the transistors MN1, MN2. The biasing voltage may also be applied to the transistor MN3.

In some embodiments, the method 500 and the method 600 may be practiced simultaneously in the voltage differential sense amplifier circuit 100. However, in some embodiments, only the method 600 or 500 is used.

The method 500 is a method for biasing a sense-amplifier. The sense-amplifier 102 includes a first and second pluralities of transistors. The method includes generating, by a first bias control circuit, a temperature dependent first bias voltage based on junction leakages at body terminals of the first plurality of transistors of the sense-amplifier 102, and providing, by the first bias control circuit, the temperature dependent first bias voltage to the body terminals of the first plurality of transistors for controlling threshold voltages of the first plurality of transistors.

The method 600 provides generating, by a second bias control circuit, a temperature dependent second bias voltage based on junction leakages at body terminals of the second plurality of transistors of the sense-amplifier 102, providing, by the second bias control circuit, the temperature dependent second bias voltage to the body terminals of the second plurality of transistors for controlling threshold voltages of the second plurality of transistors.

The first plurality of transistors includes a plurality of pull-up transistors and the second plurality of transistors includes a plurality of pull-down transistors. In some embodiments, the first plurality of transistors includes a plurality of PMOS transistors and the second plurality of transistors includes a plurality of NMOS transistors.

The first biasing control circuit includes a PMOS transistor fabricated in a diode configuration in which a drain and a gate of the first biasing transistor are connected to a supply voltage, and a source of the first biasing transistor is connected to the body terminals of each of the first plurality of transistors.

The second biasing control circuit includes an NMOS transistor fabricated in a diode configuration in which a source and a gate of the second biasing transistor are connected to a ground, and a drain of the second biasing transistor is connected to the body terminals of each of the second plurality of transistors.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A voltage differential sense amplifier circuit for a semiconductor memory circuit, comprising:
    a first and second pluralities of transistors;
    a first bias control circuit to bias the first plurality of transistors, wherein the first bias control circuit is connected to body terminals of the first plurality of transistors for providing a temperature dependent first bias voltage to control threshold voltages of the first plurality of transistors, wherein the temperature dependent first bias voltage is generated based on junction leakages at the body terminals of the first plurality of transistors, wherein the first bias control circuit includes a first biasing transistor in a diode configuration in which a source and a body terminal of the first biasing transistor are both directly connected to a supply voltage, and a drain and a gate of the first biasing transistor are both directly connected to the body terminals of each of the first plurality of transistors without also being connected to ground; and
    a second bias control circuit to bias the second plurality of transistors, wherein the second bias control circuit is connected to body terminals of the second plurality of transistors for providing a temperature dependent second bias voltage to control threshold voltages of the second plurality of transistors, wherein the temperature dependent second bias voltage is generated based on junction leakages at the body terminals of the second plurality of transistors, wherein the second bias control circuit includes a second biasing transistor in a diode configuration in which a source and a body terminal of the second biasing transistor are both directly connected to ground, and a drain and a gate of the second biasing transistor are both directly connected to the body terminals of each of the second plurality of transistors without also being connected to the supply voltage.

2. The voltage differential sense amplifier circuit of claim 1, wherein the first plurality of transistors includes pull-up transistors and the second plurality of transistors includes pull-down transistors.

3. The voltage differential sense amplifier circuit of claim 1, wherein the first plurality of transistors are PMOS transistors and the second plurality of transistors are NMOS transistors.

4. The voltage differential sense amplifier circuit of claim 1, wherein the first biasing transistor is a PMOS transistor and the second biasing transistor is an NMOS transistor.

5. The voltage differential sense amplifier circuit of claim 1, wherein the temperature dependent first bias voltage and the temperature dependent second bias voltage are higher at a first temperature than a second temperature, wherein the first temperature is less than the second temperature.

6. The voltage differential sense amplifier circuit of claim 1, wherein the first bias control circuit and the second bias control circuit regulate a write margin and an operational speed of the memory cell by controlling the threshold voltages.

7. The voltage differential sense amplifier circuit of claim 1, wherein the first and the second plurality of transistors are configured to be coupled to a bit line of a memory cell, wherein the memory cell is a static random access memory (SRAM) cell.

8. The voltage differential sense amplifier circuit of claim 1, wherein the first and the second plurality of transistors are configured to be coupled to a bit line of a memory cell, wherein the memory cell is a read only memory (ROM) cell.

9. A method for biasing a voltage differential sense amplifier circuit for a memory cell, the voltage differential sense amplifier circuit including first and second pluralities of transistors, the method comprising:

generating, by a first bias control circuit, a temperature dependent first bias voltage based on junction leakages at body terminals of the first plurality of transistors of the memory cell, wherein the first bias control circuit includes a first biasing transistor in a diode configuration in which a source and a body terminal of the first biasing transistor are both directly connected to a supply voltage, and a drain and a gate of the first biasing transistor are both directly connected to the body terminals of each of the first plurality of transistors without also being connected to ground;

providing, by the first bias control circuit, the temperature dependent first bias voltage to the body terminals of the first plurality of transistors for controlling threshold voltages of the first plurality of transistors;

generating, by a second bias control circuit, a temperature dependent second bias voltage based on junction leakages at body terminals of the second plurality of transistors of the memory cell, wherein the second bias control circuit includes a second biasing transistor in a diode configuration in which a source and a body terminal of the second biasing transistor are both directly connected to ground, and a drain and a gate of the second biasing transistor are both directly connected to the body terminals of each of the second plurality of transistors without also being connected to the supply voltage; and providing, by the second bias control circuit, the temperature dependent second bias voltage to the body terminals of the second plurality of transistors for controlling threshold voltages of the second plurality of transistors.

10. The method of claim 9, wherein the first plurality of transistors includes a plurality of pull-up transistors and the second plurality of transistors includes a plurality of pull-down transistors.

11. The method of claim 9, wherein the first plurality of transistors includes a plurality of PMOS transistors and the second plurality of transistors includes a plurality of NMOS transistors.

12. The method of claim 9, wherein the first biasing transistor is a PMOS transistor.

13. The method of claim 9, wherein the second biasing transistor is an NMOS transistor.

14. The method of claim 9, wherein the temperature dependent first bias voltage and the temperature dependent second bias voltage are higher at a first temperature than a second temperature, wherein the first temperature is less than the second temperature. The first bias control circuit and the second bias control circuit regulate a write margin and an operational speed of the memory cell by controlling the threshold voltages.

* * * * *